United States Patent
Akiyama (10) Patent No.: US 8,472,494 B2
(45) Date of Patent: Jun. 25, 2013

(54) SEMICONDUCTOR LASER SILICON WAVEGUIDE SUBSTRATE, AND INTEGRATED DEVICE

(75) Inventor: Suguru Akiyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/212,496

(22) Filed: Aug. 18, 2011

(65) Prior Publication Data

US 2011/0299561 A1  Dec. 8, 2011

Related U.S. Application Data

(63) Continuation of application No. PCT/JP2009/054162, filed on Mar. 5, 2009.

(51) Int. Cl.
*H01S 5/00* (2006.01)

(52) U.S. Cl.
USPC ............. 372/50.11; 372/43.01; 372/50.1

(58) Field of Classification Search
USPC ................. 372/43.01, 50.1, 50.11
See application file for complete search history.

(56) References Cited

U.S. PATENT DOCUMENTS

| 7,564,889 B2* | 7/2009 | Matsui et al. | 372/96 |
| 7,773,652 B2* | 8/2010 | Takagi et al. | 372/50.1 |
| 2008/0002929 A1* | 1/2008 | Bowers et al. | 385/15 |
| 2009/0059988 A1* | 3/2009 | Sekiguchi | 372/50.11 |
| 2010/0128576 A1* | 5/2010 | Fang et al. | 369/13.24 |
| 2010/0142580 A1* | 6/2010 | Gilet et al. | 372/50.11 |
| 2010/0265980 A1* | 10/2010 | Matsuda | 372/46.01 |

FOREIGN PATENT DOCUMENTS

| JP | 2002-353559 A | 12/2002 |
| JP | 2002353559 | * 12/2002 |
| JP | 2007-243072 A | 9/2007 |

OTHER PUBLICATIONS

Y. De Koninch et al., "Cavity Enhanced Reflector Based Hybrid Silicon Laser", 2010, IEEE, pp. 469-470.*
Fang, Alexander W. et al "A distributed feedback silicon evanescent laser," Optics Express, Mar 31, 2008, vol. 16 No. 7, pp. 4413-4419.
Fang, Alexander W. et al "Distributed Feedback Silicon Evanescent Laser," OFC/NFOEC 2008.
Fang, Alexander W. et al "Electrically pumped hybrid AlGaInAs-silicon evanescent laser," Optics Express, Oct. 2, 2006, vol. 14, No. 20, pp. 9203-9210.

(Continued)

*Primary Examiner* — Tod T Van Roy
*Assistant Examiner* — Delma R Forde
(74) *Attorney, Agent, or Firm* — Westerman, Hattori, Daniels & Adrian, LLP (57) ABSTRACT

A semiconductor laser includes: a first portion, made from a silicon-containing material, including an optical waveguide, a first diffraction grating including a phase shift, and a second diffraction grating; a second portion including a light-emitting layer made from a material different from that of the first portion; a laser region including the first diffraction grating, and the optical waveguide and the light-emitting layer provided in a position corresponding to the first diffraction grating; and a mirror region including the second diffraction grating, and the optical waveguide and the light-emitting layer provided in a position corresponding to the second diffraction grating.

18 Claims, 7 Drawing Sheets

OTHER PUBLICATIONS

International Search Report of PCT/JP2009/054162, mailing date Jun. 2, 2009.

Jeong, Seok-Hwan et al "Polarization-Independent All-Optical Switching in a Nonlinear GaInAsP-InP Highmesa Waveguide With a Vertically Etched Bragg Reflector," IEEE Journal of Quantum Electronics, Jul. 2002, vol. 38 No. 7, pp. 706-715.

Kim, Hyo-Chang et al. "1.5-mm-Wavelength Distributed Feedback Lasers with Deeply Etched First-Order Vertical Grating," Japanese Journal of Applied Physics, 2001, vol. 40, pp. L1107-L1109.

Park, Hyundai et al "A Hybrid AlGaInAs-Silicon Evanescent Amplifier," IEEE Photonics Technology Letters, Feb. 15, 2007, vol. 19 No. 4, pp. 230-232.

* cited by examiner

SEMICONDUCTOR LASER SILICON WAVEGUIDE SUBSTRATE, AND INTEGRATED DEVICE

CROSS-REFERENCE TO RELATED APPLICATIONS

This application is a continuation application of a PCT international application No. PCT/JP2009/054162 filed on Mar. 5, 2009 in Japan, the entire contents of which are incorporated by reference.

FIELD

The embodiments relate to a semiconductor laser, a silicon waveguide substrate, and an integrated device.

BACKGROUND

In recent years, fabrication of semiconductor lasers has been studied using silicon materials, which are unsuitable by nature for light sources due to their low light emission efficiency.

For example, evanescent lasers have been developed, wherein a group III-V material with a higher light emission efficiency is wafer-bonded over a silicon waveguide formed over a silicon substrate, such that light propagating through the silicon waveguide evanescently couples to the group III-V material, thereby providing an optical gain. In other words, hybrid integrated evanescent lasers have been developed, wherein a group III-V material is hybrid integrated to a silicon substrate.

Some of such hybrid integrated evanescent lasers have a distributed feed-back (DFB) laser configuration, wherein a diffraction grating with a $\lambda/4$ phase shift is provided on the surface on the silicon substrate side, thereby attaining single mode oscillation. Another type of lasers has tapered both end faces of a group III-V material in order to reduce reflections at the both end faces of the group III-V material.

SUMMARY

According to an aspect of the embodiment, a semiconductor laser includes a first portion, made from a silicon-containing material, including an optical waveguide, a first diffraction grating including a phase shift, and a second diffraction grating; a second portion including a light-emitting layer made from a material different from that of the first portion; a laser region including the first diffraction grating, and the optical waveguide and the light-emitting layer provided in a position corresponding to the first diffraction grating; and a mirror region including the second diffraction grating, and the optical waveguide and the light-emitting layer provided in a position corresponding to the second diffraction grating.

According to another aspect of the embodiment, a semiconductor laser includes: a first portion, made from a silicon-containing material, including an optical waveguide including a rib-structure waveguide core and a first diffraction grating including a phase shift; and a second portion, made from a material different from that of the first portion, including a light-emitting layer provided where light propagating through the optical waveguide can evanescently couple, wherein the first diffraction grating is formed on sides of the rib-structure waveguide core.

According to a further aspect of the embodiment, a silicon waveguide substrate includes: a silicon substrate; a silicon oxide film formed over the silicon substrate; a silicon layer, formed over the silicon oxide film, including a rib-structure waveguide core; a first diffraction grating, formed on sides of the rib-structure waveguide core, and including a phase shift; and a second diffraction grating formed on the sides of the rib-structure waveguide core so as to be continuous with the first diffraction grating.

According to a further aspect of the embodiment, an integrated device includes the above semiconductor laser; and a functional device, wherein the semiconductor laser and the functional device are integrated on a single silicon substrate.

The object and advantages of the embodiment will be realized and attained by means of the elements and combinations particularly pointed out in the claims. It is to be understood that both the foregoing general description and the following detailed description are exemplary and explanatory and are not restrictive of the embodiment, as claimed.

DESCRIPTION OF EMBODIMENTS

In a typical DFB laser with a $\lambda/4$ phase shift, in order to attain a stable single mode oscillation, light reflections at the laser end faces (reflected light) should be reduced, and/or a phase shift of reflected light should be eliminated.

Hybrid integrated evanescent lasers of the above-described types, however, cannot reduce reflections nor eliminate phase shifts.

Stating more specifically, a hybrid integrated evanescent laser has a region wherein a group III-V material is bonded over a silicon waveguide and a region without a group III-V material bonded thereover, and consequently, these regions have different waveguide structures. Thus, the equivalent refractive index varies along the waveguide, making the boundary of these regions reflection-prone.

Furthermore, processing the positions of the both end faces in the optical axis direction of the group III-V material so as to be aligned with the phase of the diffraction grating formed on the silicon substrate side is quite difficult. As a result, it is also difficult to prevent occurrence of a phase shift of reflected light.

Furthermore, in lasers having tapered structures on the both end faces of a group III-V material as set forth above, the width of a tip of tapered structure has to be significantly reduced. Such processing is generally difficult, and consequently, it is difficult to obtain the desired reflectivity and prevent the yield from decreasing. Furthermore, while the tip of the tapered structure has to be processed so as to be aligned with the center of the silicon waveguide, such axis alignment is also generally difficult, and consequently, it is difficult to obtain the desired reflectivity, prevent the yield from decreasing and obtain a stable single mode oscillation.

Accordingly, attaining a stable single mode oscillation is desired while improving the yield.

Hereinafter, a semiconductor laser, a silicon waveguide substrate, and a method of manufacturing the same according to an embodiment will be described with reference to FIGS. 1-4.

A semiconductor laser (laser diode) according to the present embodiment is used as a light source for optical communications, for example, and is a hybrid integrated laser (hybrid laser), wherein a silicon substrate and a light-emitting material are hybrid integrated by bonding them together. Furthermore, this semiconductor laser is an evanescent laser, wherein a light-emitting material is bonded (fused) to a silicon substrate including a silicon waveguide, such that light propagating through the silicon waveguide evanescently couples to the light-emitting material, thereby providing an optical gain.

Figure 1:
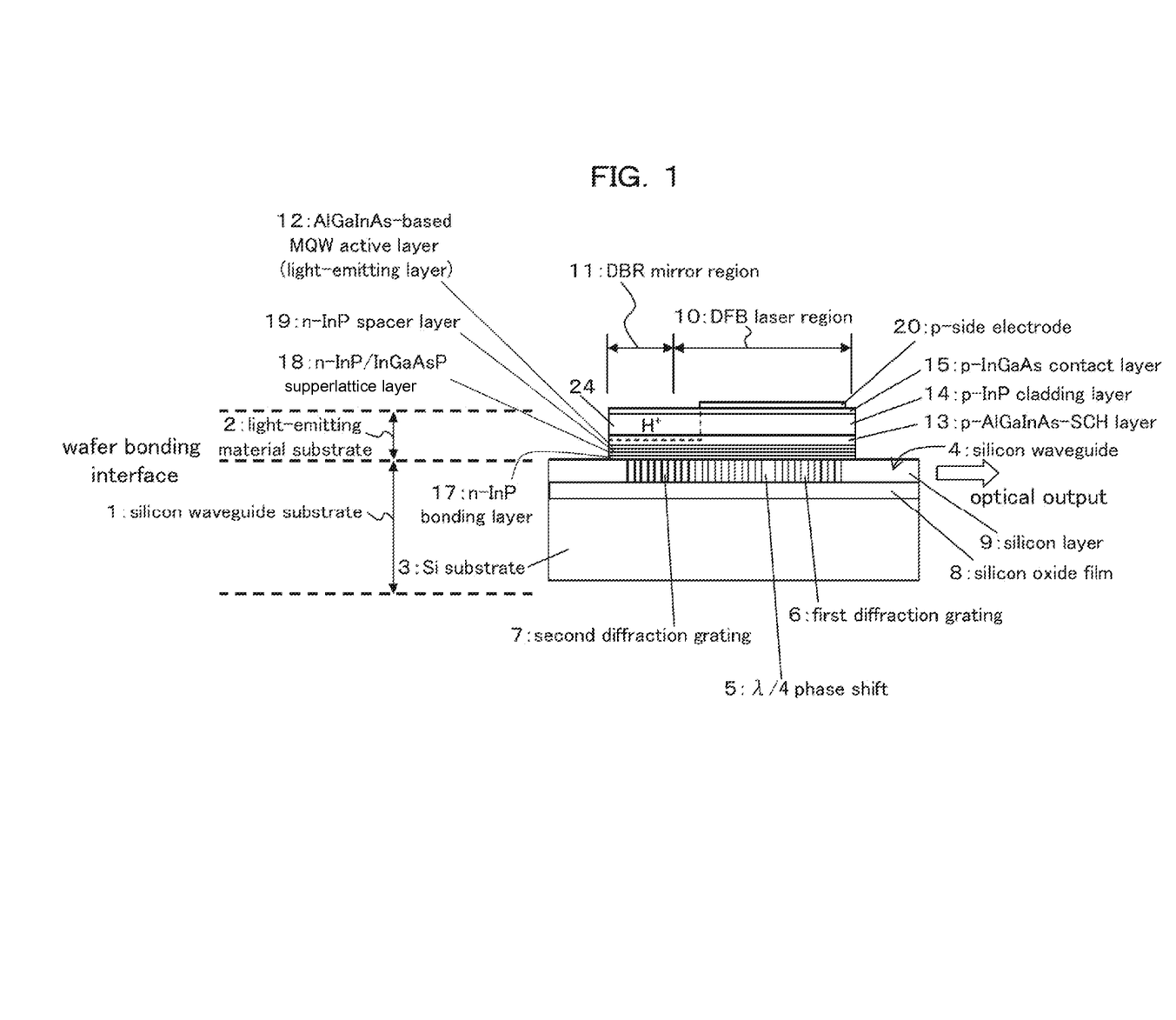
FIG. 1 is a schematic cross-sectional view (cross-sectional view in the optical axis direction) illustrating the configuration of a semiconductor laser according to a present embodiment.

As depicted in FIG. 1, the semiconductor laser of this embodiment is a hybrid integrated evanescent laser, wherein a light-emitting material substrate (light-emitting material device; second portion) 2 is wafer-bonded over a silicon waveguide substrate (silicon waveguide device; first portion) 1 including a waveguide structure over a silicon substrate 3.

In this embodiment, the silicon waveguide substrate 1 is made from a silicon-containing material.

The silicon waveguide substrate 1 includes the silicon substrate 3; a silicon waveguide 4 formed over the silicon substrate 3; a first diffraction grating 6 that includes a phase shift 5 to determine the oscillation wavelength of the laser; and a second diffraction grating 7 functioning as a reflection mirror for the oscillation wavelength of the laser. Note that the silicon substrate 3 may be any silicon-containing substrate. The silicon waveguide 4 may be any optical waveguide made from a silicon-containing material.

Figure 2:
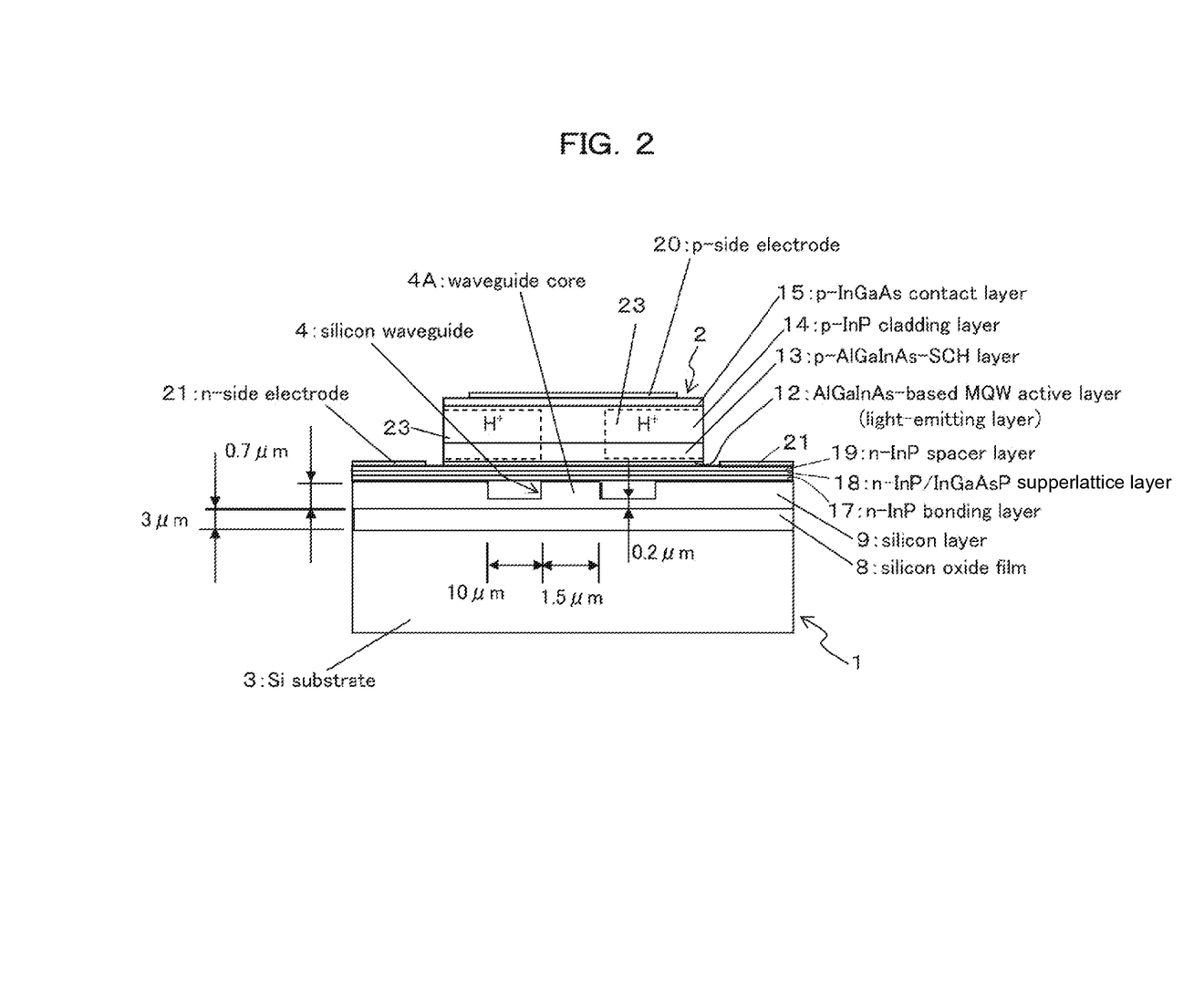
FIG. 2 is a schematic cross-sectional view (cross-sectional view in the direction perpendicular to the optical axis) illustrating the configuration of the semiconductor laser according to the present embodiment.

In this embodiment, the silicon waveguide 4 in the silicon waveguide substrate 1 includes a rib-structure waveguide core 4A, as depicted in FIG. 2.

Specifically, the silicon waveguide substrate 1 includes the silicon substrate 3, a silicon oxide film 8 formed over the silicon substrate 3, and a silicon layer 9 formed over the silicon oxide film 8 and including the rib-structure waveguide core 4A.

In this embodiment, a silicon on insulator (SOI) substrate wherein the silicon layer 9 is formed over the silicon substrate 3 sandwiching the silicon oxide film 8, and the waveguide core 4A having the cross-sectional structure as depicted in FIG. 2 is formed, is used as the silicon waveguide substrate 1. More specifically, as depicted in FIG. 2, the SOI substrate wherein its silicon layer 9 is processed to form the waveguide core 4A with a rib-structure cross-section, is used as the silicon waveguide substrate 1.

Note that the silicon oxide film 8 is also referred to as a buried oxide film (BOX layer). while, the silicon layer 9 is also referred to as a silicon thin layer (SOI layer). In this embodiment, the silicon oxide film 8 has a thickness of approximately 3 μm. The silicon layer 9 has a thickness of approximately 0.7 μm.

In this embodiment, as depicted in FIG. 2, the rib portion of the rib-structure waveguide core 4A has a width of approximately 1.5 μm and a thickness of approximately 0.7 μm. In addition, slab portions of the rib-structure waveguide core 4A extending toward opposite sides of the rib portion (portions of the silicon layer 9 having reduced thicknesses; slab layer) have a width of approximately 10 μm and a thickness of approximately 0.2 μm. Furthermore, the portions continuous with the slab portions of the rib-structure waveguide core 4A (silicon layer 9) has a thickness of approximately 0.7 μm.

Figure 3:
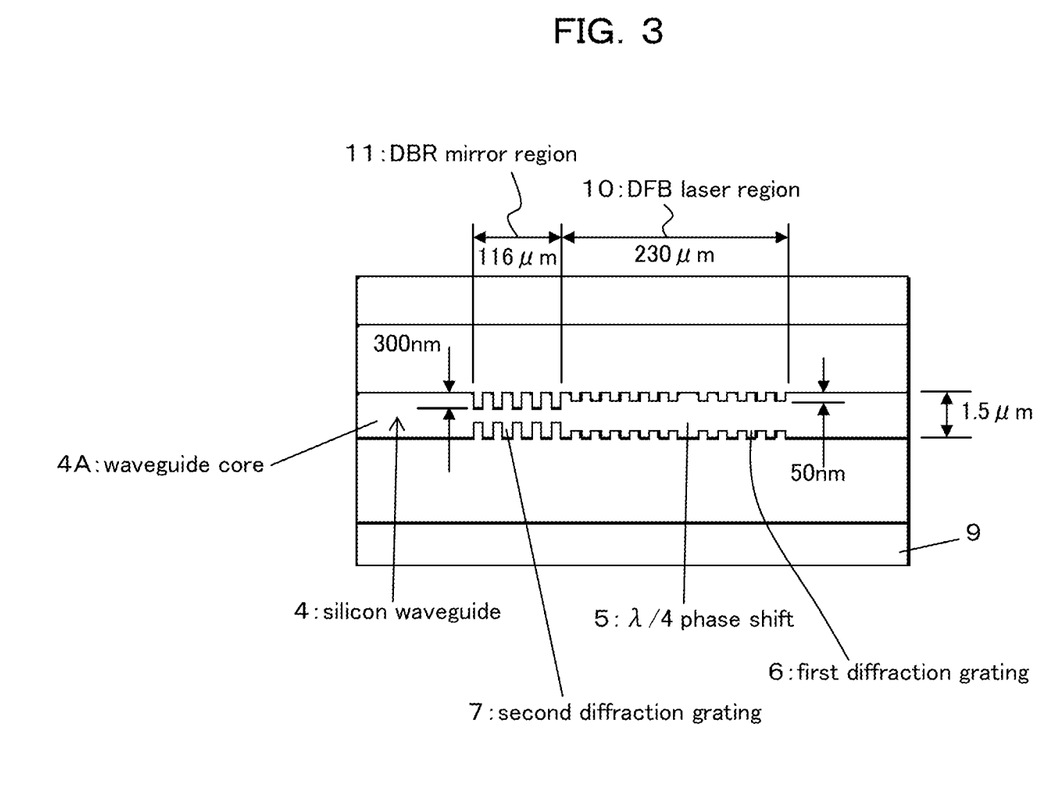
FIG. 3 is a schematic plan view illustrating the configuration of a silicon waveguide substrate constructing the semiconductor laser according to the present embodiment.

In this embodiment, as depicted in FIG. 3, the first diffraction grating 6 including the phase shift 5 and the second diffraction grating 7 are formed on the sides of the rib-structure waveguide cores 4A constructing the silicon waveguide 4.

In this embodiment, the second diffraction grating 7 is provided at one side of the direction along the optical waveguide 4 (in this embodiment, the rear end face side; the side opposing to where laser light is output; the left side in FIG. 3), so as to be continuous with the first diffraction grating 6.

In addition, the second diffraction grating 7 has a coupling coefficient higher than that of the first diffraction grating 6.

In this embodiment, the first diffraction grating 6 and the second diffraction grating 7 of different coupling coefficients are formed by periodically varying the width of the waveguide core 4A of the silicon waveguide 4. Note that the first diffraction grating 6 has a constant coupling coefficient. The second diffraction grating 7 also has another constant coupling coefficient.

In other words, the diffraction grating formed in a region of one side of the direction along the optical waveguide 4 (second diffraction grating formation region) has deeper diffraction grating groove (i.e., has a narrower waveguide core width), as compared to the diffraction grating formed in a region of the other side of the direction along the optical waveguide 4 (first diffraction grating formation region). Thereby, the second diffraction grating 7 having a coupling coefficient greater than the coupling coefficient of the first diffraction grating 6 is formed so as to be continuous with the first diffraction grating 6. In this case, since the first diffraction grating 6 and the second diffraction grating 7 can be formed simultaneously in a single process, it is possible to form the first diffraction grating 6 and the second diffraction grating 7 continuously while preventing a phase shift to be introduced between them.

As described above, in this embodiment, the penetration length of light into the DBR mirror region 11 is significantly reduced by setting the coupling coefficient of the second diffraction grating 7 in the DBR mirror region 11 to be larger than the coupling coefficient of the first diffraction grating 6 in the DFB laser region 10. This can help to suppress reduction in the laser light output caused by absorption of the light in the light-emitting layer (active layer) 12 in the DBR mirror region 11 set forth above.

In addition, since the rib-structure waveguide core 4A is defined in the silicon layer 9 formed over the silicon oxide film 8, the refractive index contrast between the core (silicon thin layer) and the cladding (air or the silicon oxide film) is increased. Accordingly, the coupling coefficient can be increased as compared to a structure wherein a diffraction grating is formed in a waveguide made from a group III-V material, even if the grooves in the diffraction grating have the identical depth.

Specifically, the first diffraction grating 6 including the phase shift 5 and the second diffraction grating 7 are formed in the following steps.

As depicted in FIG. 3, portions of the rib-structure waveguide core 4A constructing the silicon waveguide 4, wherein the first diffraction grating 6 and the second diffraction grating 7 are not formed, have a width of approximately 1.5 µm.

In contrast, the waveguide core 4A in the DFB laser region 10 is constructed such that a waveguide core with a width of approximately 1.5 µm and a waveguide core with a width of approximately 1.4 µm are arranged alternatingly with a period of approximately 230.0 nm. In other words, the side diffraction grating as the first diffraction grating 6 is formed by forming periodic grooves of a depth of approximately 0.1 µm on the sides of the rib-structure waveguide core 4A in the DFB laser region 10.

In this embodiment, the coupling coefficient of the first diffraction grating 6 in the DFB laser region 10 is approximately 130/cm. In addition, the entire length in optical axis direction of the first diffraction grating 6 in the DFB laser region 10 is approximately 230 µm.

In contrast, the waveguide core 4A in the DBR mirror region 11 is constructed such that a waveguide core with a width of approximately 1.5 µm and a waveguide core with a width of approximately 0.9 µm are arranged alternatingly with a period of approximately 230.9 nm. In other words, the side diffraction grating as the second diffraction grating 7 is formed by forming periodic grooves of a depth of approximately 0.6 µm on the sides of the rib-structure waveguide core 4A in the DBR mirror region 11.

In this embodiment, the coupling coefficient of the second diffraction grating 7 in the DBR laser region 11 is approximately 500/cm. In addition, the entire length in optical axis direction of the second diffraction grating 7 in the DBR laser region 11 is approximately 116 µm.

Since the first diffraction grating 6 and the second diffraction grating 7 are formed simultaneously in a single process, as will be described later, substantially no phase shift is introduced between the first diffraction grating 6 and the second diffraction grating 7.

As described above, in this embodiment, since the first diffraction grating 6 and the second diffraction grating 7 are formed simultaneously side by side on the sides of the waveguide core 4A, the coupling coefficient of the diffraction grating can be varied while avoiding a phase shift between the DFB laser region 10 and the DBR mirror region 11.

In contrast, in a structure wherein a diffraction grating is formed on the surface of a silicon waveguide substrate, simultaneous formation of diffraction gratings of different coupling coefficients is difficult, which makes formation of a diffraction grating with different coupling coefficients while avoiding a phase shift difficult.

In addition, in this embodiment, the phase shift 5 is a λ/4 phase shift, which is provided at the center in the optical axis direction in the region wherein the first diffraction grating 6 is formed. This helps to attain a single mode oscillation.

The light-emitting material substrate (wafer) 2 includes a light-emitting layer 12 made from a material different from that of the silicon waveguide substrate 1, as depicted in FIGS. 1 and 2. In other words, the light-emitting material substrate 2 includes the light-emitting layer 12 made from a light-emitting material different from the silicon-containing material.

In this embodiment, the light-emitting layer 12 is a group III-V semiconductor layer made from a group III-V semiconductor material. The light-emitting material substrate 2 including such a light-emitting layer 12 made from a group III-V semiconductor material is formed over a substrate (semiconductor substrate; not illustrated) made from a material different from the material of the silicon substrate, e.g., a group III-V semiconductor substrate made from a group III-V semiconductor material.

In this embodiment, the light-emitting material substrate 2 is the one prepared by forming a semiconductor stack structure including the light-emitting layer 12 made from a group III-V semiconductor material over a group III-V semiconductor substrate (not illustrated; for example InP substrate), followed by removal of the group III-V semiconductor substrate (not illustrated).

Specifically, the light-emitting material substrate 2 has a structure wherein an AlGaInAs-based multiple quantum well (MQW) active layer, as the light-emitting layer 12, a p-type AlGaInAs—SCH layer 13, a p-type InP cladding layer 14, and a p-type InGaAs contact layer 15 are stacked in this order according to their proximities to the silicon waveguide substrate 1, while bonding them to the silicon waveguide substrate 1, as depicted in FIGS. 1 and 2.

In this embodiment, the AlGaInAs-based MQW active layer 12 is a non-doped 1.3Q-AlGaInAs/1.7Q-AlGaInAs MQW layer. In contrast, the p-type AlGaInAs—SCH layer 13 is a p-doped 1.3Q-AlGaInAs—SCH layer.

The non-doped 1.3Q-AlGaInAs/1.7Q-AlGaInAs MQW layer 12 has thicknesses of approximately 10 nm/approximately 7 nm (×8 period) for example. The p-doped 1.3Q-AlGaInAs—SCH layer 13 has a thickness of approximately 0.25 µm, for example. The p-type InP cladding layer 14 is approximately 0.5 µm thick, for example. The p-type InGaAs contact layer 15 is approximately 0.1 µm thick, for example.

Note that the details of the light-emitting material substrate 2 are described in Hyundai Park et al., "A Hybrid AlGaInAs-Silicon Evanescent Amplifier", IEEE PHOTONICA TECNOLOGY LETTERS, VOL.19, No. 4, p. 230, Feb. 15, 2007 the entire content of which is incorporated herein by reference, for example.

Figure 4:
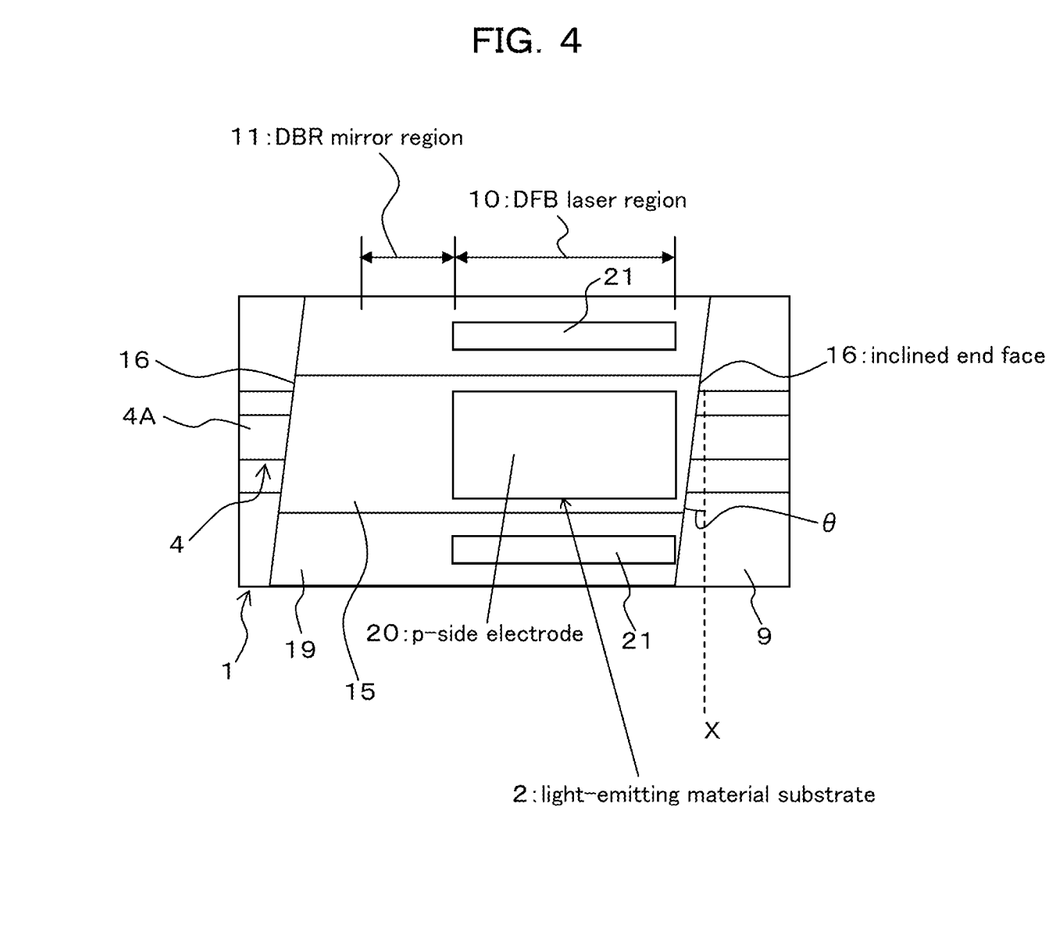
FIG. 4 is a schematic plan view illustrating the configuration of a semiconductor laser according to the present embodiment.

In addition, in this embodiment, as depicted in FIG. 4, the both end faces (terminating end faces) of the light-emitting material substrate 2, especially the both end faces (terminating end faces) of the light-emitting layer 12, are each inclined about 5° to about 15° (about 7° in this embodiment) with respect to the direction perpendicular to the optical waveguide 4 (the plane perpendicular to the optical axis; indicated by reference symbol X in FIG. 4). In other words, the light-emitting material substrate 2, especially the light-emitting layer 12, has inclined end faces (oblique end faces) 16 which define an angle θ of about 5° to about 15° (about 7° in this embodiment) with respect to the direction perpendicular to the optical waveguide 4. This can reduce reflections at the both end faces of the light-emitting layer 12, especially at the emitting face of the DFB laser region 10 to a sufficient level. Thus, unlike conventional lasers, a stable single mode oscillation can be attained without requiring tapered structures at the both end faces, which are difficult to manufacture.

While the both end faces of the light-emitting layer 12 are formed so as to be inclined about 5° to about 15° with respect to the direction perpendicular to the optical waveguide 4 this embodiment, this is not limiting. As described above, the second diffraction grating 7 (see FIG. 3) is provided at one side of the direction along the optical waveguide (in this embodiment, the rear end face side; the side opposing to where the laser light is output; the left side in FIG. 3). Thus, it is suffice that the end face on the other side of the direction along the optical waveguide of the light-emitting layer 12 (in this embodiment, the front end face; the end face where the laser light is output; the right side in FIG. 4) may be inclined about 5° to about 15° with respect to the direction perpendicular to the optical waveguide. Thereby, a stable single mode oscillation can be attained without requiring tapered structure which is difficult to manufacture, as conventional lasers, on the front end face side of the laser wherein the second diffraction grating 7 is not provided.

Thereafter, in this embodiment, as depicted in FIG. 1, the silicon waveguide substrate 1 constructed as set forth above and the light-emitting material substrate 2 constructed as described above are bonded together.

In the bonding, the light-emitting layer 12 is provided where light propagating through the silicon waveguide 4 can evanescently couples.

Specifically, as depicted in FIGS. 1 and 2, the light-emitting material substrate 2 is bonded to the silicon waveguide substrate 1, interposing an n-type InP bonding layer 17, an n-type InGaAsP/InP supperlattice (SL) layer 18, and an n-type InP spacer layer 19.

In this embodiment, the n-type InGaAsP/InP supperlattice layer 18 is an n-doped 1.1Q-InGaAsP/InP supperlattice layer. The n-type InP bonding layer 17 has a thickness of approximately 10 nm, for example. The n-type InGaAsP/InP supperlattice layer 18 has thicknesses of approximately 7.5 nm/approximately 7.5 nm (×2 period), for example. The n-type InP spacer layer 19 has a thickness of approximately 110 nm, for example.

In this embodiment, the first diffraction grating 6 and the second diffraction grating 7 are formed portions of the silicon waveguide 4 in the direction along the silicon waveguide 4. In other words, the silicon waveguide 4 extends beyond the DFB laser region 10 and the DBR mirror region 11. Then, the silicon waveguide substrate 1 and the light-emitting material substrate 2 are bonded together such that the light-emitting layer 12 formed in the light-emitting material substrate 2 completely covers the first diffraction grating 6 and the second diffraction grating 7 formed in the silicon waveguide substrate 1. In this embodiment, as depicted in FIGS. 1, 2, and 4, the ends of the light-emitting material substrate 2 are located outside where the first diffraction grating 6 and the second diffraction grating 7 are formed in the optical axis direction.

In addition, in this embodiment, as will be described later, a p-side electrode 20 is provided over the light-emitting material substrate 2, while n-side electrodes 21 are provided on opposite sides of the light-emitting material substrate 2. For this purpose, when bonding the light-emitting material substrate 2 over the silicon waveguide substrate 1, the n-type InP bonding layer 17, the n-type InGaAsP/InP supperlattice layer 18, and the n-type InP spacer layer 19, which are to be sandwiched between the silicon waveguide substrate 1 and the light-emitting material substrate 2, extend outwardly from the both sides of the light-emitting material substrate 2. The n-side electrodes 21 are provided over the n-type InP spacer layer 19 provided on opposite sides of the light-emitting material substrate 2.

As a result, in this embodiment, a mesa structure defined by the light-emitting material substrate 2 is provided over the silicon waveguide substrate 1.

While the n-type InP bonding layer 17, the n-type InGaAsP/InP supperlattice layer 18, and the n-type InP spacer layer 19 are sandwiched between the silicon waveguide substrate 1 and the light-emitting material substrate 2 when bonding the light-emitting material substrate 2 over the silicon waveguide substrate 1, this is not limiting. The light-emitting material substrate 2 may be bonded to the silicon waveguide substrate 1 using a semiconductor layer. The semiconductor layer to be sandwiched between the silicon waveguide substrate 1 and the light-emitting material substrate 2 may be formed to extend outwardly from both sides of the light-emitting material substrate 2, and electrodes may be provided over the semiconductor layer provided on opposite sides of the light-emitting material substrate 2. In this structure, the semiconductor layer functions as both a bonding layer and a contact layer.

Figure 5:
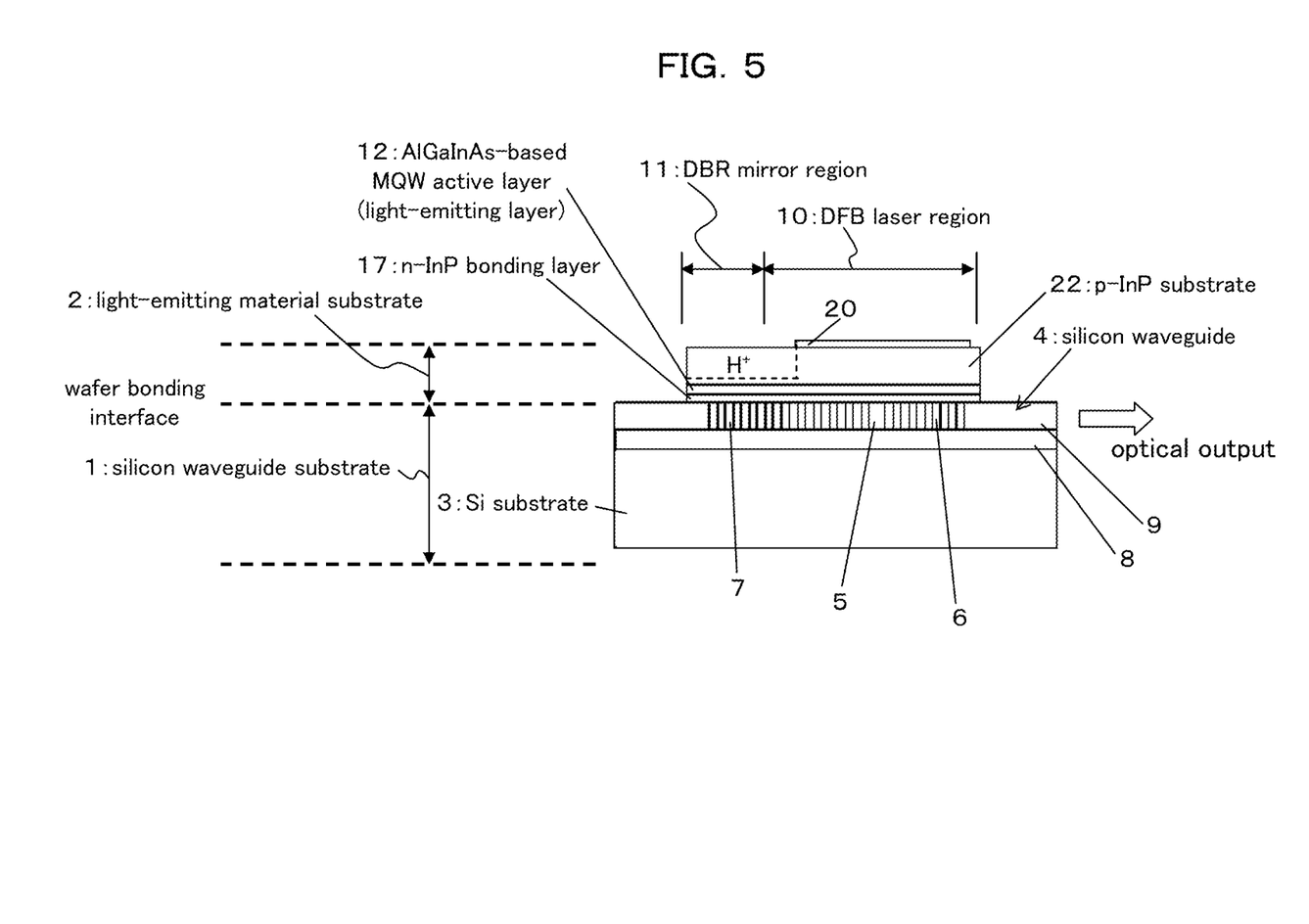
FIG. 5 is a schematic cross-sectional view (cross-sectional view in the optical axis direction) illustrating the configuration of a variant of the semiconductor laser according to the present embodiment.

Furthermore, the structure of the light-emitting material substrate 2 and the structures of layers to be sandwiched upon bonding the light-emitting material substrate 2 over the silicon waveguide substrate 1 are not limited to those in the above-described embodiment. For example, as depicted in FIG. 5, a light-emitting material substrate 2 may be formed including a p-type InP substrate 22 and an AlGaInAs-based MQW layer (light-emitting layer) 12, and an n-type InP bonding layer (semiconductor layer) 17 may be used for bonding the light-emitting material substrate 2 over a silicon waveguide substrate 1. In this case, the n-type InP bonding layer 17, the AlGaInAs-based MQW active layer 12, and the p-type InP substrate 22 are provided, in this order according to their proximities to the silicon waveguide substrate 1, while bonding the light-emitting material substrate 2 to the silicon waveguide substrate 1. In FIG. 5, the same elements as those in the above-described embodiment (see FIG. 1) are referenced by the like reference symbols.

This semiconductor laser includes a distributed feedback laser region (DFB laser region; DFB laser section) 10 and a distributed Bragg reflector (DBR) mirror region (DBR mirror section) 11, as depicted in FIG. 1.

In this example, the DFB laser region 10 includes the first diffraction grating 6 including the phase shift 5, and the optical waveguide 4 and the light-emitting layer 12 provided in the position corresponding to the first diffraction grating 6. The DFB laser region 10 is adapted to induce current injection into the light-emitting layer 12.

In this embodiment, the DFB laser region 10 is provided with the electrodes 20 and 21 for current injection, as depicted in FIGS. 1, 2, and 4, accordingly, is adapted to induce current injection into the light-emitting layer (active layer) 12 provided in the position corresponding to the first diffraction grating 6.

In other words, the electrode 20 is provided in the region right above the first diffraction grating 6, i.e., the region right above the light-emitting layer 12 provided in the position corresponding to the first diffraction grating 6, for injecting currents into the light-emitting layer 12. In addition, the electrodes 21 are formed over the semiconductor layer (the n-type InP spacer layer 19 in this embodiment) extending outwardly from the both sides of the light-emitting material substrate 2, for injecting currents into the light-emitting layer 12. Thereby, light propagating through the silicon waveguide 4 evanescently couples to the light-emitting layer 12 which is subjected to current injection through the electrodes 20 and 21, thereby providing an optical gain. In other words, the DFB laser region 10 functions as an active waveguide region.

Specifically, as depicted in FIGS. 1 and 2, in the DFB laser region 10, the metal electrode (p-side electrode in this embodiment) 20 is formed over the p-type InGaAs contact layer 15, i.e., the top layer in the light-emitting material substrate 2.

In addition, as depicted in FIG. 2, in the DFB laser region 10, the surface of the n-type InP spacer layer 19 is exposed on opposite sides of the light-emitting material substrate 2, and the metal electrodes (n-side electrodes in this embodiment) 21 are formed over the surface of the n-type InP spacer layer 19.

In addition, the DFB laser region 10 is provided with higher-resistance regions 23 on opposite sides of the region between the electrode 20 and the waveguide core 4A, as depicted in FIG. 2, to form a current blocking structure for limiting the current injection only to the vicinity of the waveguide core. In this embodiment, the p-type InP cladding layer 14 located on opposite sides of the region above the rib portion of the waveguide core 4A is subjected to proton injection, to increase the resistance, thereby forming the higher-resistance regions 23.

In addition, since this embodiment is provided with the DFB laser region 10 including the first diffraction grating 6 having a $\lambda/4$ phase shift 5 formed at its center, it is possible to achieve a single wavelength mode oscillation at the center wavelength of the stop band of the first diffraction grating 6.

The DBR mirror region 11 is provided on the rear end face side of the DFB laser region 10, as depicted in FIG. 1, and includes the second diffraction grating 7 having a coupling coefficient larger than that of the first diffraction grating 6, and the optical waveguide 4 and the light-emitting layer 12 provided in the position corresponding to the second diffraction grating 7.

In this embodiment, the light-emitting layer 12 is also provided in the DBR mirror region 11 so as to be continuous with the light-emitting layer 12 in the DFB laser region 10. This prevents reflections at the boundary between the DFB laser region 10 and the DBR mirror region 11, and a stable single mode oscillation can be attained by preventing a phase shift of reflected light.

As described above, this embodiment is provided with the DBR mirror region 11 including the second diffraction grating 7 having a coupling coefficient larger than that of the first diffraction grating 6 of the DFB laser region 10, on the rear end face side of the DFB laser region 10. Accordingly, the light generated at the DFB laser region 10 and output from the both end faces of the DFB laser region 10 toward the DBR mirror region 11 is reflected at the DBR mirror region 11 to return to the DFB laser region 10.

Therefore, in this embodiment, light is output only from the front end face of the DFB laser region 10, i.e., the end face opposing to where the DBR mirror region 11 is provided.

This provides a two-fold increase in the optical output, as compared to a structure wherein light is output from the both end faces of conventional lasers, thereby enabling a greater optical output.

More specifically, the output from conventional $\lambda/4$ shift DFB lasers reported in Alexander W. Fang et al., "*A distributed feedback silicon evanescent laser,*" Optics Express, vol.16, no. 7 pp 4413-4419the entire content of which is incorporated herein by reference, for example, is as small as 3.5 mW (at 20° C.) and 0.2 mW (at 50° C.) at maximum. Generally, in optical communication, since increasing optical output (intensity) on the transmitting side provides better optical transmissions, such reduction in optical output from a laser is not desirable.

In contrast, in this embodiment, since the DBR mirror region 11 is provided to output light only from the end face opposing to where the DBR mirror region 11 is provided, the optical output can be increased.

The DBR mirror region 11 is adapted not to induce current injection into the light-emitting layer 12. In this embodiment, the DBR mirror region 11 is not provided with an electrode for current injection, and is adapted not to induce current injection into the light-emitting layer 12 provided in the position corresponding to the second diffraction grating 7. In other words, the DBR mirror region 11 functions as a passive waveguide region.

As described above, this embodiment is adapted such that current injection is induced only in the DFB laser region 10 without inducing current injection in the DBR mirror region 11. For this purpose, an electrode 20 is provided only in the DFB laser region 10 and not in the DBR mirror region 11, as depicted in FIG. 1.

Furthermore, in this embodiment, the DBR mirror region 11 is provided with a higher-resistance region 24 for preventing currents from being injected. In this embodiment, the entire p-type InP cladding layer 14 in the DBR mirror region 11 is subjected to proton injection to increase the resistance, thereby forming the higher-resistance region 24.

In addition, in this embodiment, since the first diffraction grating 6 in the DFB laser region 10 and the second diffraction grating 7 in the DBR mirror region 11 are formed simultaneously, no phase shift is introduced in the diffraction grating at the boundary between the DFB laser region 10 and the DBR mirror region 11. Consequently, even if light reflected at the DBR mirror region 11 returns to the DFB laser region 10, a stable single mode oscillation can be attained in the DFB laser region 10. In other words, a stable single mode oscillation can be attained without requiring tapered structure which is difficult to manufacture, as conventional lasers, on the rear end face side of the laser.

As described above, no tapered structure which is difficult to manufacture is required on the both end face sides of the laser, which eliminates the issues of the processing accuracy and axis alignment. Thus, a stable single mode oscillation can be attained while improving the yield.

While the laser region is fabricated as a DFB laser region in this embodiment, any laser region can be used which includes a first diffraction grating, and an optical waveguide and a light-emitting layer provided in the position corresponding to the first diffraction grating. Furthermore, while the mirror region is fabricated as a DBR mirror region, any mirror region can be used which includes a second diffraction grating, and an optical waveguide and a light-emitting layer provided in the position corresponding to the second diffraction grating.

Furthermore, while electrodes are provided in the DFB laser region whereas no electrode is provided in the DBR mirror region in this embodiment, this is not limiting. For example, respective electrodes are provided in the laser region and the mirror region, and the mirror region is provided with a higher-resistance region between the corresponding electrode and the light-emitting layer. Thereby, the DFB laser region is adapted to induce current injection into the light-emitting layer while the DBR mirror region is adapted not to induce current injection in the light-emitting layer.

Next, a method of manufacturing a silicon waveguide substrate 1 according to this embodiment will be described.

A silicon waveguide substrate 1 is fabricated by processing an SOI substrate including a silicon substrate 3, a silicon oxide film (BOX layer) 8, and a silicon layer (silicon thin layer; SOI layer) 9, as depicted in FIGS. 1-3. In other words, the SOI substrate includes the silicon layer 9 formed over the silicon substrate 3, interposing the silicon oxide film 8. A rib-structure waveguide core 4A is formed by processing the silicon layer 9. At the same time, the first diffraction grating 6 including the phase shift 5, and the second diffraction grating 7 having a coupling coefficient greater than the coupling coefficient of the first diffraction grating 6 are formed simultaneously on the sides of the rib-structure waveguide core 4A. In this manner, the silicon waveguide substrate 1 is fabricated.

Specifically, a waveguide pattern for defining the rib-structure waveguide core 4A is formed over the silicon layer 9, by means of electric beam exposure, for example.

In this embodiment, in order to form the first diffraction grating 6 and the second diffraction grating 7 on the sides of the rib-structure waveguide core 4A, a waveguide pattern (drawing pattern) including a diffraction grating pattern to define the first diffraction grating 6 and the second diffraction grating 7 is formed when drawing the waveguide pattern.

The diffraction grating pattern to define the first diffraction grating 6 and the second diffraction grating 7 is drawn by varying the waveguide width.

The waveguide pattern including the diffraction grating pattern is then transferred to the silicon layer 9 with dry etching, for example.

In the above steps, as depicted in FIGS. 1-3, the rib-structure waveguide core 4A is defined in the silicon layer 9. At the same time, the first diffraction grating 6 and the second diffraction grating 7 having different depths of diffraction grating groove are formed on the side of the waveguide core 4A. In other words, the first diffraction grating 6 and the second diffraction grating 7 of different coupling coefficients are formed simultaneously in a single process. This, substantially no phase shift is introduced between the first diffraction grating 6 and the second diffraction grating 7.

In this manner, the silicon waveguide substrate 1 (first portion), including the rib-structure waveguide core 4A (optical waveguide made from a silicon-containing material) formed in the silicon layer 9, the first diffraction grating 6 including the phase shift 5, and the second diffraction grating 7, is formed.

Next, a method of manufacturing a semiconductor laser according to the present embodiment will be described.

In this embodiment, as depicted in FIGS. 1, 2, and 4, over the silicon waveguide substrate 1 fabricated in the processes set forth above, a light-emitting material substrate 2 (group III-V semiconductor substrate in this embodiment) including a light-emitting layer 12 (group III-V semiconductor layer in this embodiment) is bonded to fabricate a semiconductor laser.

In this embodiment, the silicon waveguide substrate 1 and the light-emitting material substrate 2 are bonded together (wafer-bonded), interposing an n-type InP bonding layer 17, an n-type InGaAsP/InP supperlattice layer 18, and an n-type InP spacer layer 19.

Specifically, over a p-type InP substrate (not illustrated), a p-type InGaAs contact layer 15, a p-type InP cladding layer 14, a p-type AlGaInAs—SCH layer 13, an AlGaInAs-based MQW active layer (light-emitting layer) 12, the n-type InP spacer layer 19, the n-type InGaAsP/InP supperlattice layer 18, and the n-type InP bonding layer 17 are sequentially stacked. In other words, the light-emitting material substrate 2 (second portion; group III-V semiconductor substrate in this embodiment) including the light-emitting layer 12 (group III-V semiconductor layer in this embodiment) made from a material different from a silicon-containing material (group III-V semiconductor material in this embodiment), is formed. In addition, the n-type InP spacer layer 19, the n-type InGaAsP/InP supperlattice layer 18, and the n-type InP bonding layer 17 are formed, which are to be sandwiched between the silicon waveguide substrate 1 and the light-emitting material substrate 2, when bonding of the silicon waveguide substrate 1 and the light-emitting material substrate 2 in a subsequent process.

Subsequently, the light-emitting material substrate 2 including the n-type InP spacer layer 19, the n-type InGaAsP/InP supperlattice layer 18, and the n-type InP bonding layer 17 formed thereover, is positioned over the silicon waveguide substrate 1 fabricated in the above-described steps, with the n-type InP bonding layer 17 facing downward, followed by bonding the two substrates.

After removing the p-type InP substrate (not illustrated), non-required portions of the p-type InGaAs contact layer 15, the p-type InP cladding layer 14, the p-type AlGaInAs—SCH layer 13, and the AlGaInAs-based MQW active layer (light-emitting layer) 12 are removed by etching, for example.

In the above steps, the mesa-shaped light-emitting material substrate 2, including the p-type InGaAs contact layer 15, the p-type InP cladding layer 14, the p-type AlGaInAs—SCH layer 13, and the AlGaInAs-based MQW active layer (light-emitting layer) 12, is formed, as depicted in FIGS. 1 and 2. As a result, the first diffraction grating 6 and the second diffraction grating 7 formed in the silicon waveguide substrate 1 are completely covered with the light-emitting layer 12 in the light-emitting material substrate 2. In addition, as depicted in FIG. 2, the surface of the n-type InP spacer layer 19 is exposed on opposite sides of the mesa-shaped light-emitting material substrate 2. Furthermore, as depicted in FIG. 4, the both end faces of the light-emitting material substrate 2 are configured to be located outside where the first diffraction grating 6 and the second diffraction grating 7 are formed, in the optical axis direction, and to be inclined about 5° to about 15° with respect to the direction perpendicular to the optical waveguide 4.

Subsequently, the n-type InP spacer layer 19, the n-type InGaAsP/InP supperlattice layer 18, and the n-type InP bonding layer 17 are removed by etching, for example.

Consequently, as depicted in FIG. 4, the both end faces of the n-type InP spacer layer 19, the n-type InGaAsP/InP supperlattice layer 18, and the n-type InP bonding layer 17 is configured to be located outside where the first diffraction grating 6 and the second diffraction grating 7 are formed, in the optical axis direction, and to be inclined about 5° to about 15° with respect to the direction perpendicular to the optical waveguide 4.

Thereafter, electrodes 20 and 21 are formed in the DFB laser region 10.

More specifically, a p-side the electrode 20 is formed over the p-type InGaAs contact layer 15, i.e., the top layer of the light-emitting material substrate 2. On the other hand, the n-side electrodes 21 are formed over the n-type InP spacer layer 19 exposed on opposite sides of the light-emitting material substrate 2.

In this manner, a semiconductor laser is fabricated including the silicon waveguide substrate 1 and the light-emitting material substrate 2 which are bonded together, interposing the n-type InP bonding layer 17, the n-type InGaAsP/InP supperlattice layer 18, and the n-type InP spacer layer 19. In other words, the semiconductor laser is fabricated which includes a DFB laser region 10 including the rib-structure waveguide core 4A (optical waveguide), the first diffraction grating 6 including the phase shift 5, and the light-emitting layer 12; and a DBR mirror region 11 including the rib-structure waveguide core 4A (optical waveguide), the second diffraction grating 7, and the light-emitting layer 12.

Note that the details of the method of manufacturing a semiconductor laser are described in Hyundai Park et al., "A Hybrid AlGaInAs-Silicon Evanescent Amplifier", IEEE PHOTONICA TECNOLOGY LETTERS, VOL.19, No. 4, p. 230, Feb. 15, 2007 the entire content of which is incorporated herein by reference, for example.

Thus, the semiconductor laser according to the present embodiment is advantageous in that a stable single mode oscillation can be attained while improving the yield, as well as increasing the optical output from the semiconductor laser.

Particularly, since the DBR mirror region 11 is provided beside one of the sides of the DFB laser region 10 in this embodiment, nearly a two-fold increase in the optical output is expected through calculations, as compared to conventional lasers without such a DBR mirror region.

In addition, since the end faces of the light-emitting material substrate 2 are inclined from the plane perpendicular to the silicon waveguide 4 in this embodiment, reflection in the end face, where light is output, of the DFB laser region 10 can be reduced by about 10 dB, as compared to lasers with vertical end faces.

In this manner, a stable single mode oscillation can be attained with less stricter requirements for the processing accuracy, only by providing a DBR mirror region 11 beside one of the sides of a DFB laser region 10 and providing an inclination to the end face of the light-emitting material substrate 2 in the other of the sides of the DFB laser region 10.

While the above-described embodiment and its variant have been described with reference to the example wherein a multiple quantum well layer made from a group III-V material is used as the light-emitting layer 12, this is not limiting. For example, a light-emitting layer having a quantum dot structure may be used. In such a case, a device with excellent temperature characteristics can be achieved.

In addition, while the above-described embodiment and its variant have been described with reference to a semiconductor laser, this is not limiting. For example, a semiconductor laser according to the above-described embodiment or its variant and functional devices may be integrated on a single silicon substrate to fabricate an integrated device.

Figure 6:
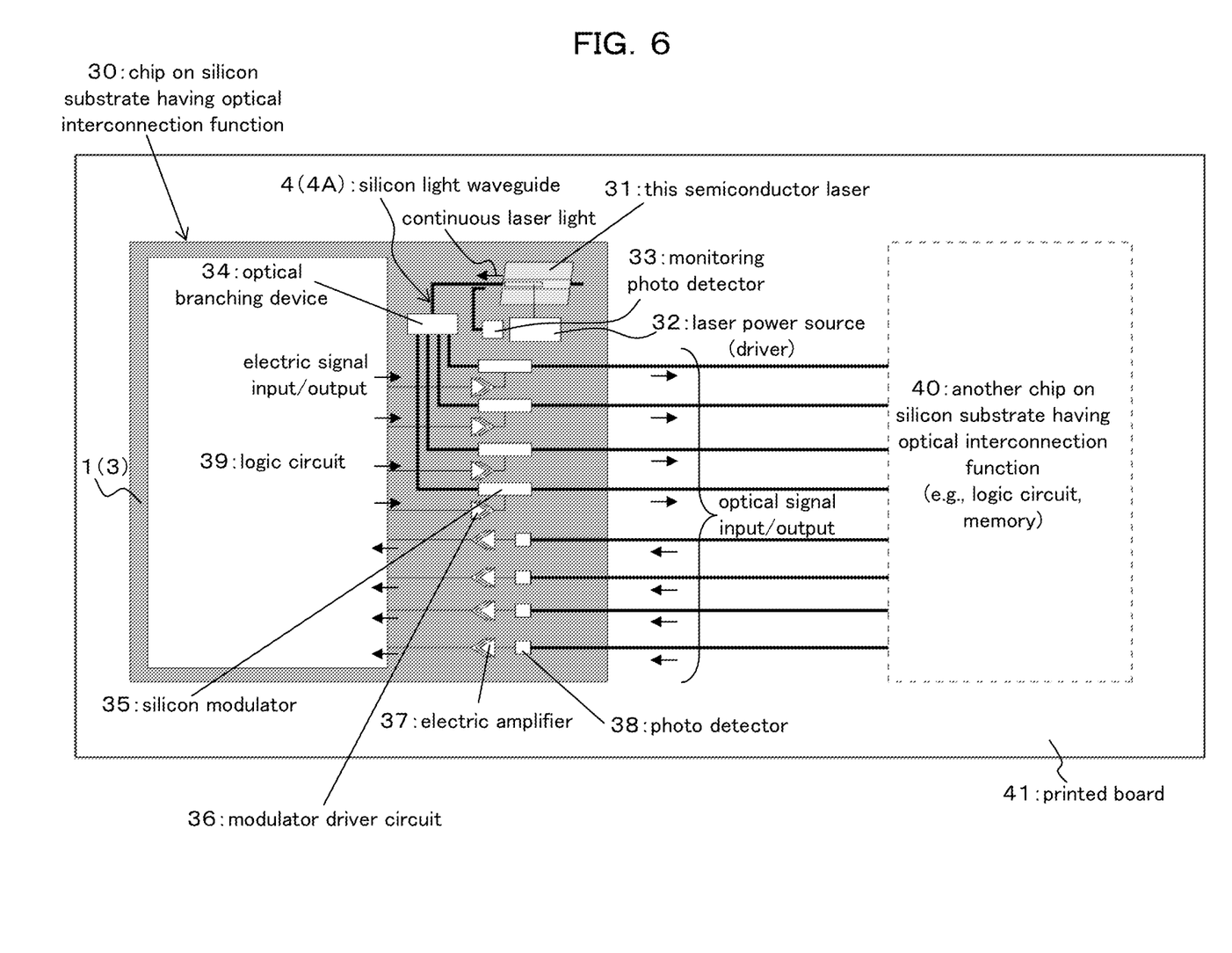
FIG. 6 is a schematic diagram illustrating the configuration of an integrated device including the semiconductor laser (integrated device having an optical interconnection function) according to the present embodiment.

For example, functional devices made from silicon-based materials may be integrated on a silicon substrate 3 including a semiconductor laser of the above-described embodiment or its variant formed therein, to fabricate a chip on silicon substrate (integrated device) 30 for performing optical interconnections, as depicted in FIG. 6. The same elements in FIG. 6 as those in the above-described embodiment (see FIGS. 1 and 2) are referenced by the like reference symbols.

More specifically, as depicted in FIG. 6, a chip 30 having an optical interconnection function may be fabricated by integrating functional devices, such as a semiconductor laser 31 of the above-described embodiment or its variant, a laser power source (driver) 32, a monitoring photo detector 33, an optical branching device 34, a silicon modulator 35, a modulator driver circuit 36, an electric amplifier 37, a photo detector 38, and a logic circuit 39, over a silicon waveguide substrate 1 including a silicon waveguide 4 (waveguide core 4A) over a silicon substrate 3.

In this chip 30 having the optical interconnection function, continuous laser light from the semiconductor laser 31 is branched by the optical branching device 34. The branched laser light is then modulated by the silicon modulator 35, which is output as an optical signal. In addition, an electric signal is entered from the logic circuit 39 to the silicon modulator 35, via the modulator driver circuit 36. On the other hand, an optical signal entered to the chip 30 is converted to an electric signal by the photo detector 38. The electric signal output from the photo detector 38 is entered to the logic circuit 39 after being amplified by the electric amplifier 37.

Here, the chip 30 having such an optical interconnection function is interconnected with another chip 40 having an optical interconnection function, which are mounted on a printed board 41.

Figure 7:
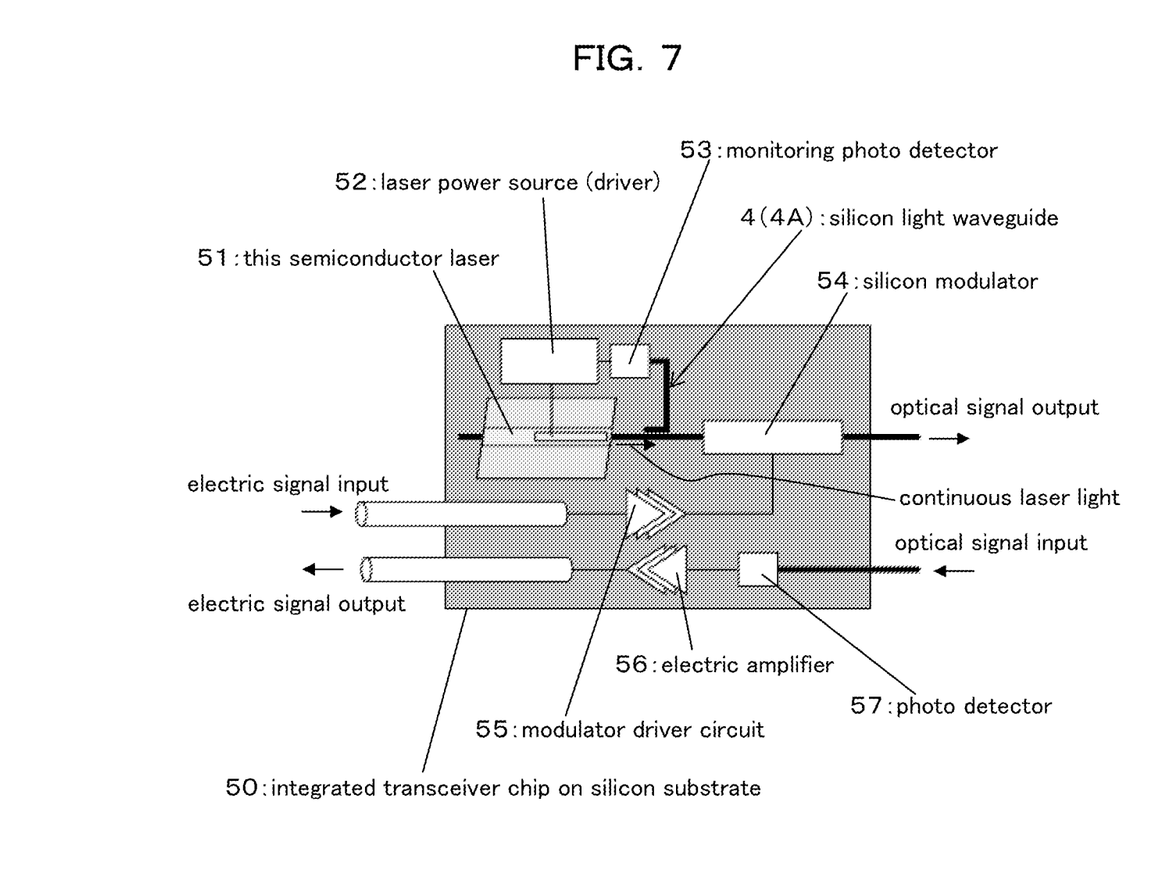
FIG. 7 is a schematic diagram illustrating the configuration of an integrated device including the semiconductor laser (integrated device having a transceiver function) according to the present embodiment.

Furthermore, functional devices made from silicon-based materials may be integrated on a silicon substrate 3 including a semiconductor laser of the above-described embodiment or its variant formed therein, to fabricate an integrated transceiver chip on silicon substrate (integrated device) 50, as depicted in FIG. 7. The same elements in FIG. 7 as those in the above-described embodiment (see FIGS. 1 and 2) are referenced by the like reference symbols.

More specifically, as depicted in FIG. 7, a transceiver chip 50 may be fabricated by integrating functional devices, such as a semiconductor laser 51 of the above-described embodiment or its variant, a laser power source (driver) 52, a monitoring photo detector 53, a silicon modulator 54, a modulator driver circuit (driving circuit) 55, an electric amplifier 56, and a photo detector 57, over a silicon waveguide substrate 1 including a silicon waveguide 4 (waveguide core 4A) over a silicon substrate 3.

In this transceiver chip 50, continuous laser light from the semiconductor laser 51 is modulated by the silicon modulator 54, which is output as an optical signal. In addition, an electric signal is entered to the silicon modulator 54, via the modulator driver circuit 55. On the other hand, an optical signal entered to the chip 50 is converted to an electric signal by the photo detector 57. The electric signal output from the photo detector 57 is output after being amplified by the electric amplifier 56.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments have been described in detail, it should be understood that the various changes, substitutions, and alterations could be made hereto without departing from the spirit and scope of the invention.

What is claimed is:

1. A semiconductor laser comprising:
   a first portion, made from a silicon-containing material, including an optical waveguide, a first diffraction grating having a phase shift, and a second diffraction grating;
   a second portion including a light-emitting layer made from a material different from that of the first portion;
   a laser region defined from the first diffraction grating, and the optical waveguide and the light-emitting layer provided in a position corresponding to the first diffraction grating; and
   a mirror region defined from the second diffraction grating, and the optical waveguide and the light-emitting layer provided in a position corresponding to the second diffraction grating,
   wherein the first diffraction grating and the second diffraction grating are continuously provided along the optical waveguide, and
   the second portion covers a whole of the first diffraction grating and the second diffraction grating and extends outward a distance further than the first diffraction grating and the second diffraction grating.

2. The semiconductor laser according to claim 1, wherein the laser region is adapted to induce current injection into the light-emitting layer, while the mirror region is adapted not to induce current injection into the light-emitting layer.

3. The semiconductor laser according to claim 1, wherein the laser region includes an electrode for current injection, while the mirror region includes no electrode for current injection.

4. The semiconductor laser according to claim 1, wherein the laser region and the mirror region includes respective electrodes, and the mirror region includes a higher-resistance region between the corresponding electrode and the light-emitting layer.

5. The semiconductor laser according to claim 1, wherein the first portion and the second portion are bonded together.

6. The semiconductor laser according to claim 1, wherein the light-emitting layer is provided where light propagating through the optical waveguide can evanescently couple.

7. The semiconductor laser according to claim 1, wherein the light-emitting layer is a group III-V semiconductor layer made from a group III-V semiconductor material.

8. The semiconductor laser according to claim 1, wherein the optical waveguide includes a rib-structure waveguide core, and the first diffraction grating and the second diffraction grating are formed on sides of the rib-structure waveguide core.

9. The semiconductor laser according to claim 1, wherein the second diffraction grating has a coupling coefficient larger than a coupling coefficient of the first diffraction grating.

10. The semiconductor laser according to claim 1, wherein both end faces of the light-emitting layer are each inclined the with respect to a direction perpendicular to the optical waveguide.

11. The semiconductor laser according to claim 1, wherein the second diffraction grating is provided at one side of the direction along the optical waveguide, and an end face on the other side of the direction along the optical waveguide of the light-emitting layer is inclined with respect to a direction perpendicular to the optical waveguide.

12. The semiconductor laser according to claim 1, wherein the optical waveguide includes a waveguide core, and the laser region includes an electrode and higher-resistance regions provided on opposite sides of a region between the electrode and the waveguide core.

13. The semiconductor laser according to claim 1, wherein the first portion comprises
 a silicon substrate;
 a silicon oxide film formed over the silicon substrate; and
 a silicon layer, formed over the silicon oxide film, including a rib-structure waveguide core constructing the optical waveguide,
 wherein the first diffraction grating and the second diffraction grating are formed on sides of the rib-structure waveguide core.

14. The semiconductor laser according to claim 1, wherein the first portion and the second portion are bonded together, sandwiching a semiconductor layer, the semiconductor layer extending outwardly from both sides of the second portion, and the semiconductor laser further includes electrodes over the semiconductor layer provided on opposite sides of the second portion.

15. A semiconductor laser comprising:
 a first portion, made from a silicon-containing material, including an optical waveguide, a first diffraction grating having a phase shift, and a second diffraction grating; and
 a second portion including a light-emitting layer made from a material different from that of the first portion and provided where light propagating through the optical waveguide can evanescently couple,
 wherein the first diffraction grating and the second diffraction grating are continuously provided along the optical waveguide, and
 the second portion covers a whole of the first diffraction grating and the second diffraction grating and extends outward a distance further than the first diffraction grating and the second diffraction grating.

16. The semiconductor laser according to claim 15, wherein the optical waveguide includes a rib-structure waveguide core, and the first diffraction grating and the second diffraction grating are formed on sides of the rib-structure waveguide core.

17. The semiconductor laser according to claim 15, wherein the second diffraction grating has a coupling coefficient larger than a coupling coefficient of the first diffraction grating.

18. An integrated device comprising:
 a semiconductor laser including:
  a first portion, made from a silicon-containing material, including an optical waveguide, a first diffraction grating having a phase shift, and a second diffraction grating;
  a second portion including a light-emitting layer made from a material different from that of the first portion;
  a laser region defined from the first diffraction grating, and the optical waveguide and the light-emitting layer provided in a position corresponding to the first diffraction grating; and
  a mirror region defined from the second diffraction grating, and the optical waveguide and the light-emitting layer provided in a position corresponding to the second diffraction grating; and
 a functional device,
 wherein the semiconductor laser and the functional device are integrated on a single silicon substrate,
 the first diffraction grating and the second diffraction grating are continuously provided along the optical waveguide, and
 the second portion covers a whole of the first diffraction grating and the second diffraction grating and extends outward a distance further than the first diffraction grating and the second diffraction grating.

* * * * *